US009652004B2

(12) United States Patent
Tudosoiu

(10) Patent No.: US 9,652,004 B2
(45) Date of Patent: May 16, 2017

(54) HAND-HELD ELECTRONIC DEVICES AND RELATED METHODS FOR IMPROVING THERMAL BEHAVIOR OF SUCH DEVICES

(71) Applicant: HTC Corporation, Taoyuan, Taoyuan County (TW)

(72) Inventor: Bogdan Ionut Tudosoiu, Hjarup (SE)

(73) Assignee: HTC CORPORATION, Taoyuan, Taoyuan County (TW)

( * ) Notice: Subject to any disclaimer, the term of this patent is extended or adjusted under 35 U.S.C. 154(b) by 3 days.

(21) Appl. No.: 15/012,980

(22) Filed: Feb. 2, 2016

(65) Prior Publication Data

US 2016/0154443 A1 Jun. 2, 2016

Related U.S. Application Data

(63) Continuation-in-part of application No. 13/337,444, filed on Dec. 27, 2011, now abandoned.

(51) Int. Cl.
*G06F 1/20* (2006.01)
*G06F 1/16* (2006.01)
(Continued)

(52) U.S. Cl.
CPC ............ *G06F 1/203* (2013.01); *G06F 1/1633* (2013.01); *H01L 35/28* (2013.01); *H02N 2/18* (2013.01);
(Continued)

(58) Field of Classification Search
CPC ............. H05K 7/2039; H05K 7/20963; H05K 7/20436; H02H 2/183; H02H 2/186;
(Continued)

(56) References Cited

U.S. PATENT DOCUMENTS 8,351,207 B2 1/2013 Jang et al.
8,537,555 B2 9/2013 Huang et al.
(Continued)

FOREIGN PATENT DOCUMENTS

TW 200846869 12/2008
TW M400002 3/2011
(Continued)

OTHER PUBLICATIONS

Lead Zirconate Titanate, Wikipedia, Jun. 13, 2010.
Barium Titanate, Wikipedia, Dec. 11, 2010.
Zinc Oxide, Wikipedia, Nov. 3, 2010.

*Primary Examiner* — Anatoly Vortman
*Assistant Examiner* — Jacob Crum
(74) *Attorney, Agent, or Firm* — McClure, Qualey & Rodack, LLP

(57) ABSTRACT

Hand-held electronic devices and methods for improving thermal behavior of such devices are provided. In this regard, a representative hand-held electronic device includes: a processor operative to execute instructions; a kinetic energy harvester operative to generate electrical power responsive to movement of the hand-held electronic device; and a Peltier component in thermal communication with the processor, the Peltier component being operative to receive power from the kinetic energy harvester and to remove heat from the processor.

14 Claims, 4 Drawing Sheets

HAND-HELD DEVICE 100
PROCESSOR 102
DISPLAY 104
MEMORY 106
PELTIER COMPONENT 112
POWER CONVERTER 110
KINETIC ENERGY HARVESTER 108

(51) Int. Cl.
*H01L 35/28* (2006.01)
*H02N 2/18* (2006.01)
*H05K 7/20* (2006.01)
*H04M 1/02* (2006.01)

(52) U.S. Cl.
CPC ......... *H05K 7/20436* (2013.01); *H04M 1/026* (2013.01); *H05K 7/2039* (2013.01); *H05K 7/20963* (2013.01)

(58) Field of Classification Search
CPC ......... H04M 1/026; H01L 35/28; H02N 2/18; G06F 1/1633; G06F 1/203
USPC ................ 361/679.46, 679.47; 310/339, 343
See application file for complete search history.

(56) References Cited

U.S. PATENT DOCUMENTS

2003/0183269 A1* 10/2003 Maeda .................... G06F 1/203
136/211
2008/0310108 A1 12/2008 Eriksson et al.
2009/0243433 A1 10/2009 Dirr et al.
2010/0045241 A1 2/2010 Nousiainen
2010/0136414 A1 6/2010 Choi et al.
2011/0235277 A1 9/2011 Jang et al.
2013/0082657 A1 4/2013 Rich et al.
2013/0114203 A1* 5/2013 Ignatchenko ......... G06F 1/1632
361/679.41
2015/0062816 A1* 3/2015 Godali .................... H01L 35/28
361/695
2015/0185793 A1* 7/2015 Hsieh ...................... G06F 1/203
361/679.54

FOREIGN PATENT DOCUMENTS

TW 201132920 10/2011
TW M413319 10/2011

* cited by examiner

HAND-HELD ELECTRONIC DEVICES AND RELATED METHODS FOR IMPROVING THERMAL BEHAVIOR OF SUCH DEVICES

CROSS REFERENCE TO RELATED APPLICATIONS

This is a continuation-in-part application of U.S. application Ser. No. 13/337,444 entitled "Hand-held Electronic Devices and Related Methods for Improving Thermal Behavior of Such Devices," filed on Dec. 27, 2011, the disclosure of which is incorporated herein by reference in its entirety.

TECHNICAL FIELD

The present disclosure generally relates to portable electronic devices.

BACKGROUND

Over the years, portable electronic devices (such as smartphones and hand-held gaming devices, for example) have become prevalent. Notably, more modern devices tend to have increased power requirements. Typically, increased power requirements results in increased temperature profiles for the devices that can be detrimental to onboard processors and processor behavior.

In an effort to reduce the temperatures of the processors, efforts have been placed on reducing transmitted power and/or processing speeds. Unfortunately, these efforts tend to have a detrimental effect on the experience of the user.

SUMMARY

Hand-held electronic devices and methods for improving thermal behavior of such devices are provided. Briefly described, one embodiment, among others, is a hand-held electronic device comprising: a processor operative to execute instructions; a kinetic energy harvester operative to generate electrical power responsive to movement of the hand-held electronic device; and a Peltier component in thermal communication with the processor, the Peltier component being operative to receive power from the kinetic energy harvester and to remove heat from the processor.

Another embodiment is a method for improving thermal behavior of a hand-held electronic device comprising: providing a hand-held electronic device with an onboard processor; and selectively cooling the processor responsive to movement of the device.

Other systems, methods, features, and advantages of the present disclosure will be or may become apparent to one with skill in the art upon examination of the following drawings and detailed description. It is intended that all such additional systems, methods, features, and advantages be included within this description, be within the scope of the present disclosure, and be protected by the accompanying claims.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Figure 1:
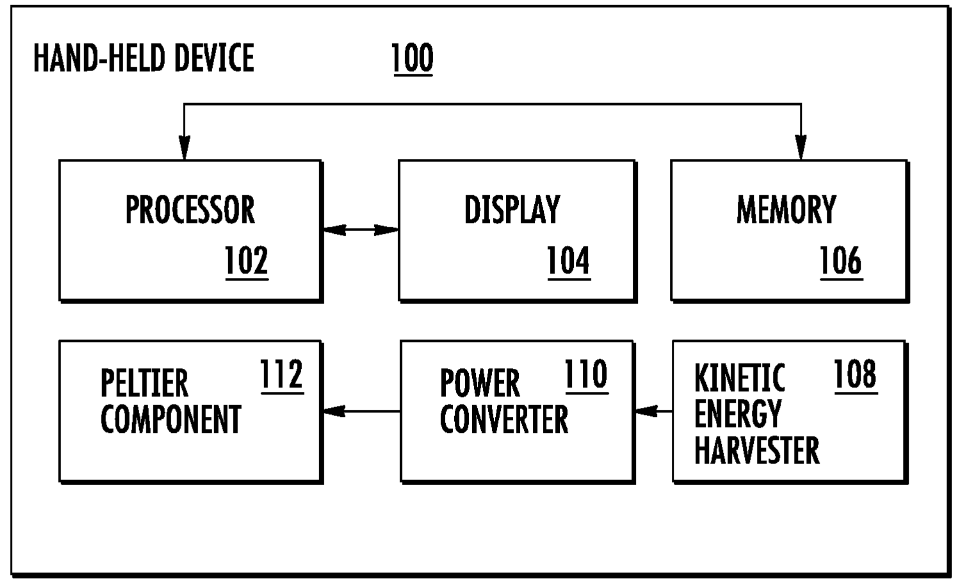
FIG. 1 is a schematic diagram depicting an example embodiment of a hand-held electronic device.

Having summarized various aspects of the present disclosure, reference will now be made in detail to that which is illustrated in the drawings. While the disclosure will be described in connection with these drawings, there is no intent to limit the scope of legal protection to the embodiment or embodiments disclosed herein. Rather, the intent is to cover all alternatives, modifications and equivalents included within the spirit and scope of the disclosure as defined by the appended claims.

Hand-held electronic devices and methods for improving thermal behavior of such devices are provided. In some embodiments, the devices (e.g., smartphones) incorporate onboard processors that generate heat during use, as well as onboard provisioning for converting movement of the device to electrical energy. In some embodiments, the power is used to operate a Peltier component that provides cooling. Notably, the Peltier component can be positioned in thermal communication with the processor. In such a configuration, the Peltier component can remove heat from the processor. For example, during use of the device for playing games, when excess heat is often generated by the processor, the Peltier component can cool the processor by using electricity that is converted from the increased movement of the device that tends to accompany game use.

An embodiment of a hand-held electronic device will now be described followed by a discussion of the operation of various components of the system. In this regard, FIG. 1 is a schematic diagram depicting an example embodiment of a hand-held electronic device. As shown in FIG. 1, device 100 incorporates a processor 102, a display 104 and a memory 106. Also included in device 100 is a kinetic energy harvester 108, a power converter 110 and a Peltier component 112. The Peltier component is positioned in thermal communication with the processor, with the cool side of the Peltier component preferably facing the processor.

In operation, the processor performs various functions, such as executing instructions that are stored in memory and which may be associated with applications (e.g., game applications). The processor also drives the display so that information is displayed to the user of the device. Of particular interest is the generation of heat by the processor while performing these functions.

Excess heat from the processor can be extracted by the Peltier component, which receives power from the kinetic energy harvester via the power converter. In this embodiment, the kinetic energy harvester uses the piezoelectric effect to convert mechanical strain into electrical power. Notably, the mechanical strain is associated with movement of the hand-held device, such as may occur during the playing of game applications. In other embodiments, various other types of kinetic energy harvesters can be used, such as those that use micro hydraulics and/or the pyroelectric effect, for example. With respect to the pyroelectric effect, in some embodiments, the heat from the processor itself is used to charge a kinetic harvester. Since the power generated may not be appropriate for direct use by the Peltier component, the power converter can be used to ensure that properly conditioned power is provided to the Peltier component.

Figure 2:
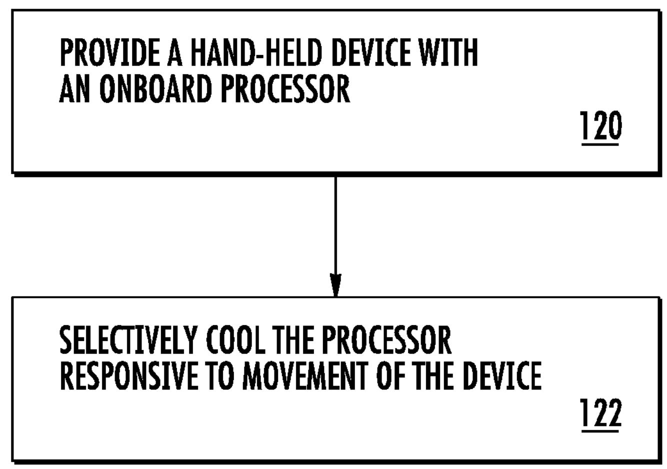
FIG. 2 is an example embodiment of a method for improving thermal behavior of a hand-held electronic device.

FIG. 2 is an example embodiment of a method for improving thermal behavior of a hand-held electronic device. As shown in FIG. 2, the method includes providing a hand-held electronic device with an onboard processor (block 120). In block 122, the processor is selectively cooled responsive to movement of the device.

Figure 3:
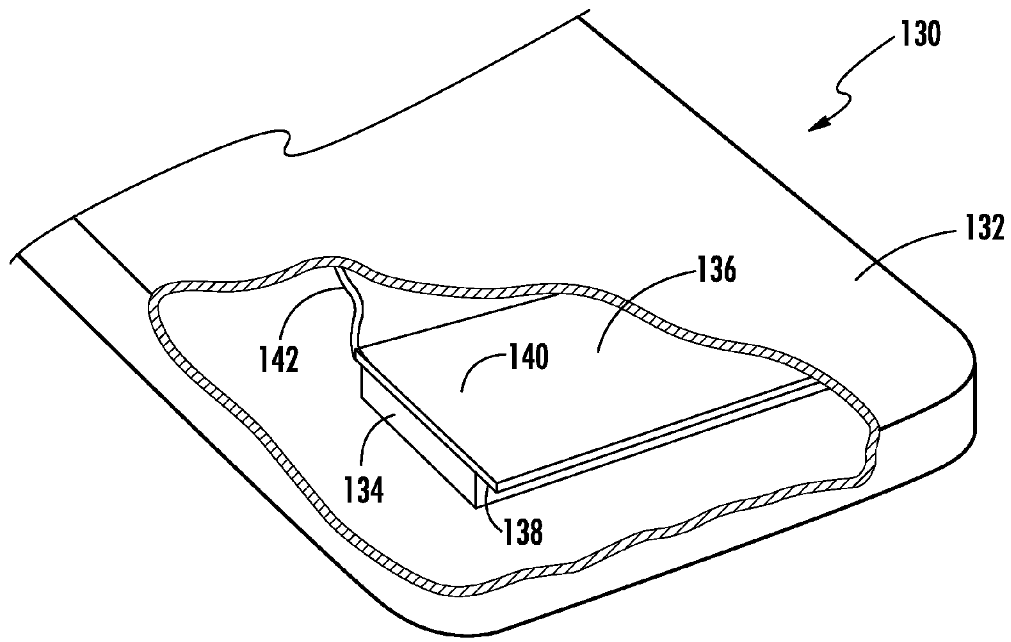
FIG. 3 is a partially cut-away, schematic view of another example embodiment of a hand-held electronic device.

FIG. 3 is a partially cut-away, schematic view of another example embodiment of a hand-held electronic device. As shown in FIG. 3, device 130 is configured as a smartphone, the exterior of which is formed at least in part by a housing 132. Within the housing is mounted a processor 134, a kinetic energy harvester (not shown) and a Peltier component 136. The Peltier component is positioned at least partially between the housing and the processor. The Peltier component also is in thermal communication with the housing such that heat from the Peltier component is dissipated by the housing. In particular, the Peltier component has a cool side 138 and a hot side 140. The cool side is positioned adjacent to (e.g., in direct contact with) the processor. One lead (142) of a set of leads also is shown that provides electrical power to the Peltier component.

Figure 4:
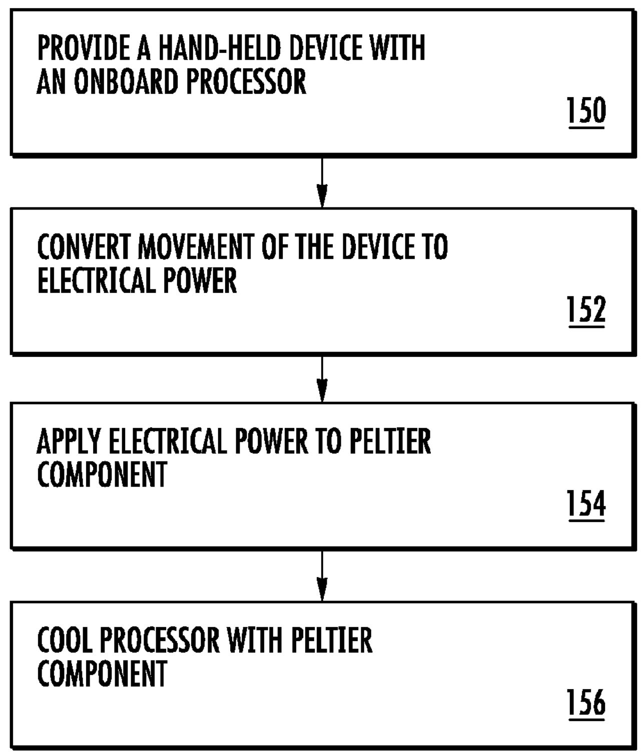
FIG. 4 is another example embodiment of a method for improving thermal behavior of a hand-held electronic device.

FIG. 4 is another example embodiment of a method for improving thermal behavior of a hand-held electronic device. As shown in FIG. 4, the method includes providing a hand-held electronic device with an onboard processor (150). In block 152, movement of the device is converted into electrical power. By way of example, converting of the movement of the device into electrical power can be performed using the piezoelectric effect.

In block 154, the electrical power is provided to a Peltier component. Thereafter, the Peltier component is used to cool the processor by extracting heat from the processor (block 156). In some embodiments, heat from the Peltier component is dissipated with a housing of the device.

Figure 5:
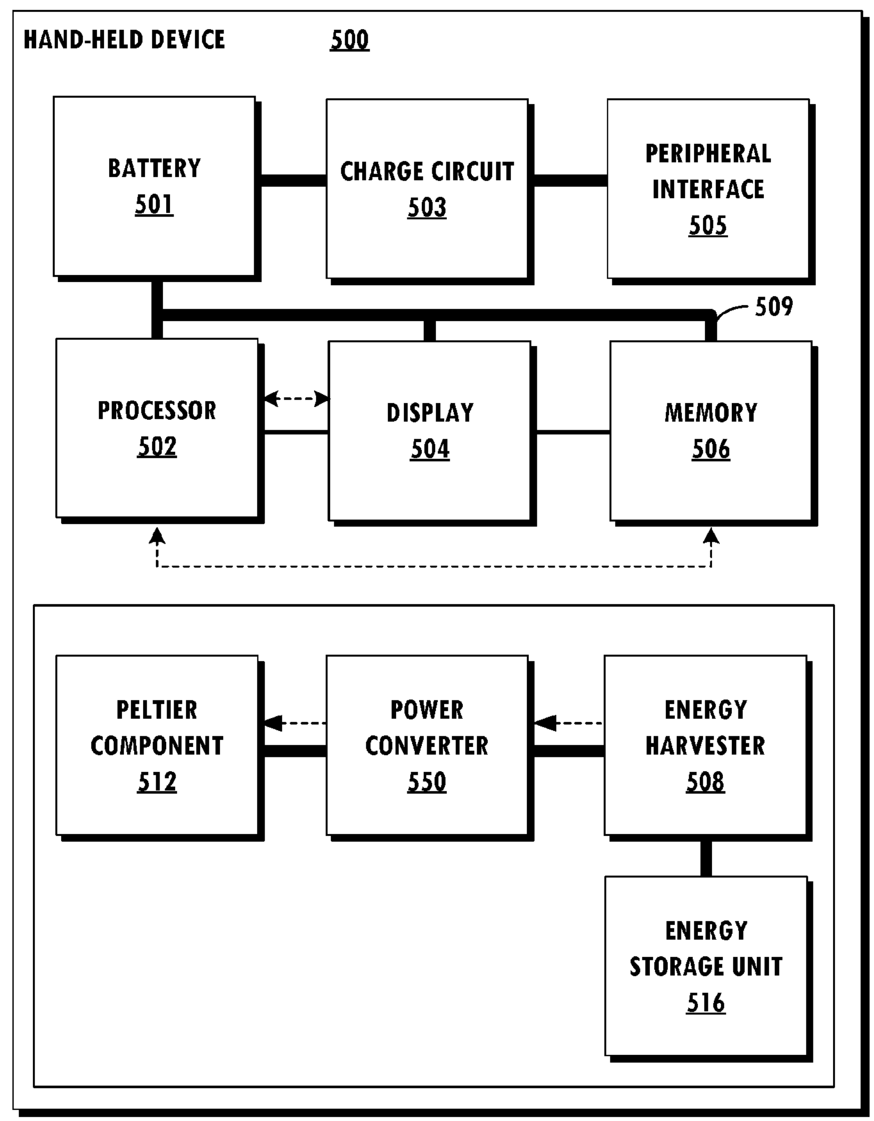
FIG. 5 is a schematic diagram depicting another example embodiment of a hand-held electronic device.

FIG. 5 is a schematic diagram depicting an alternative embodiment of a hand-held electronic device. As shown in FIG. 5, device 500 incorporates a processor 502, a display 504 and a memory 506. The device 500 also includes a battery 501, a charge circuit, and a peripheral interface 505. The battery 501 provides power to such elements as the processor 502, display 504, and memory 506 over a power bus 509. The battery 501 is also coupled to a charge circuit 503 for receiving an input voltage and for converting the voltage into a voltage suitable for charging the battery 501. The peripheral interface 505 supplies the input voltage to the charge circuit 503 and allows the device 500 to be coupled (via a wired or wireless connection) to an external device such as a charger, computer, or other device via a standard interface (e.g., USB interface). As shown by the dotted lines, the processor 502 communicates with the display 504 and the memory 506 via a data bus or other suitable interface.

Also included in device 500 is an energy harvester 508, a power converter 550 and a Peltier component 512. The Peltier component 512 is positioned in thermal communication with the processor 502, with the cool side of the Peltier component 512 preferably facing the processor 502. In operation, the processor 502 performs various functions, such as executing instructions that are stored in memory and which may be associated with applications (e.g., game applications). The processor also drives the display so that information is displayed to the user of the device. Of particular interest is the generation of heat by the processor 502 while performing these functions.

Excess heat from the processor 502 can be extracted by the Peltier component 512, which receives power from the energy harvester 508 via the power converter 550. Note that in the embodiment shown in FIG. 5, the Peltier component 512 receives power only from the energy harvester 508 and is not coupled to the battery 501. Thus, the processor 502 and the Peltier component 512 are powered independently of one another. The energy harvester 508 uses the piezoelectric effect to convert mechanical strain into electrical power. Notably, the mechanical strain is associated with movement of the hand-held device 500, such as may occur during the playing of game applications.

Figure 6:
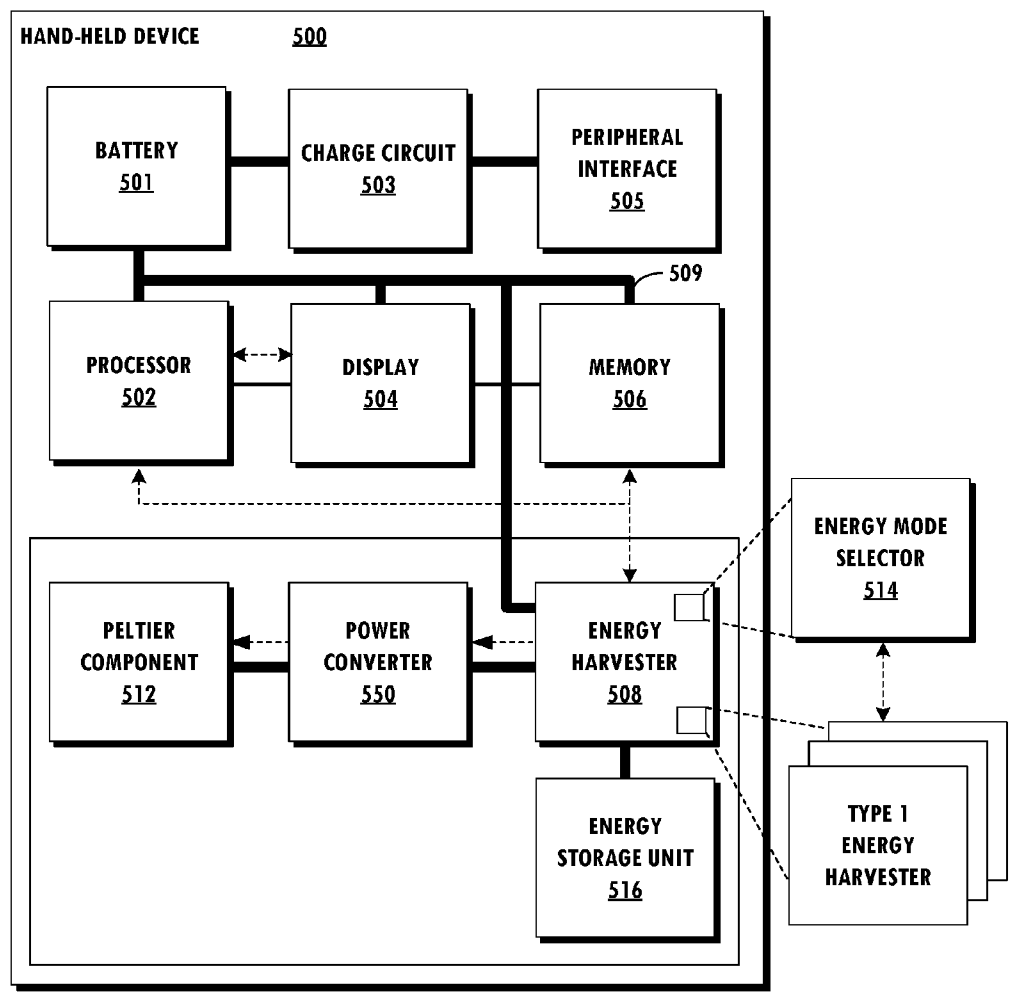
FIG. 6 is a schematic diagram depicting another example embodiment of a hand-held electronic device where the type of energy harvester is selectable.

Various other types of energy harvesters can be used, such as those that use micro hydraulics and/or the pyroelectric effect, for example. With respect to the pyroelectric effect, in some embodiments, the heat from the processor 502 itself is used to charge the energy harvester 508. Since the power generated may not be appropriate for direct use by the Peltier component 512, the power converter 550 can be used to ensure that properly conditioned power is provided to the Peltier component 512. In this regard, the energy harvester 508 may comprise different types of energy harvesters (e.g., TYPE 1, TYPE 2) that respectively use movement, micro hydraulics, pyroelectric effect, etc. Reference is made to FIG. 6, which shows a schematic diagram depicting yet another example embodiment of a hand-held electronic device. For the embodiment in FIG. 6, the energy harvester 508 includes an energy mode selector 514 for activating one or more of a plurality of energy harvester types, where selection of a particular energy harvester type may be made based on a control signal received by the processor 502. To ensure that the energy harvester 508 remains operational at all times, the device 500 may further comprise a dedicated energy storage unit 516 that stores power generated by the energy harvester. As shown by the line between the energy harvester 508 and the battery 501, the energy harvester 508 may alternatively be coupled to the battery for receiving power. However, as with the embodiment shown in FIG. 5, the Peltier component 512 in FIG. 6 is only coupled to the power converter 550 and the energy 508 and receives power solely from these components and not from the battery 501 as the processor 502 and the Peltier component 512 are powered independently of one another.

It should be emphasized that the above-described embodiments are merely examples of possible implementations. Many variations and modifications may be made to the above-described embodiments without departing from the principles of the present disclosure. By way of example, although the flowcharts show specific orders of execution, it is to be understood that the orders of execution may differ. All such modifications and variations are intended to be included herein within the scope of this disclosure and protected by the following claims.

At least the following is claimed:

1. A hand-held electronic device comprising:

a memory;

a processor electrically communicating with the memory and having processor circuitry operative to execute instructions stored in the memory;

a display electrically communicating with the processor and operative to display images responsive to inputs directed by the processor;

a kinetic energy harvester operative to generate electrical power responsive to movement of the hand-held electronic device; and a Peltier component in thermal communication with the processor, the Peltier component having a cool side facing toward the processor and a hot side facing away from the processor, the Peltier component electrically communicating with the kinetic energy harvester to receive only the electrical power generated by the kinetic energy harvester and, responsive thereto, to remove heat from the processor; and a power converter being operative to condition the electrical power received from the kinetic energy harvester, the power converter being further operative to provide the conditioned electrical power to the Peltier component;

wherein the memory, the processor and the display lack electrical connectivity with the kinetic energy harvester; and responsive to the movement of the hand-held electronic device, the electrical power from the kinetic energy harvester is used by the Peltier component to cool the cool side such that the processor is cooled.

2. The device of claim 1, wherein:

the device further comprises a housing within which the processor, the kinetic energy harvester and the Peltier component are located; and the Peltier component is positioned at least partially between the housing and the processor.

3. The device of claim 2, wherein the Peltier device is in thermal communication with the housing such that heat from the Peltier component is dissipated by the housing.

4. The device of claim 1, wherein the cool side of the Peltier component is in direct contact with the processor.

5. The device of claim 1, wherein the device is a smartphone.

6. The device of claim 1, wherein the kinetic energy harvester is operative to convert mechanical strain to electrical power.

7. The device of claim 1, wherein the kinetic energy harvester is operative to convert heat to electrical power.

8. A method for improving thermal behavior of a hand-held electronic device comprising:

providing a hand-held electronic device with an onboard processor, a kinetic energy harvester and a Peltier component;

generating electrical power with the kinetic energy harvester responsive to movement of the hand-held electronic device;

conditioning the electrical power generated by the kinetic energy harvester and providing the conditioned power to the Peltier component;

powering the processor independently from the electrical power generated from the kinetic energy harvester, wherein the Peltier component is powered only by the kinetic energy harvester; and cooling the processor with the Peltier component responsive to the movement of the device;

wherein, responsive to the movement of the hand-held electronic device, the electrical power from the kinetic energy harvester is used by the Peltier component to cool a portion of the Peltier component in thermal communication with the processor such that the processor is cooled.

9. The method of claim 8, wherein generating the electrical power is performed using the piezoelectric effect.

10. The method of claim 8, further comprising dissipating heat from the Peltier component with a housing of the device.

11. The method of claim 8, further comprising directly contacting the processor with the portion of the Peltier component.

12. The method of claim 8, wherein generating the electrical power further comprises converting heat of the device into electrical power.

13. The method of claim 12, wherein at least a portion of the heat converted into electrical power is provided by the processor.

14. A hand-held electronic device comprising:

a memory;

a processor electrically communicating with the memory and having processor circuitry operative to execute instructions stored in the memory;

a display electrically communicating with the processor and operative to display images responsive to inputs directed by the processor;

an energy harvester operative to generate electrical power responsive to heat generated by the processor;

a power converter operative to condition the electrical power received from the kinetic energy harvester; and a Peltier component operative to receive only the conditioned electrical power from the power converter, the Peltier component in thermal communication with the processor, the Peltier component having a cool side facing toward the processor and a hot side facing away from the processor; and wherein the memory, the processor and the display lack electrical connectivity with the energy harvester.

* * * * *